US008862967B2

(12) United States Patent
Pancholi et al.

(10) Patent No.: US 8,862,967 B2
(45) Date of Patent: Oct. 14, 2014

(54) STATISTICAL DISTRIBUTION BASED VARIABLE-BIT ERROR CORRECTION CODING

(75) Inventors: Deepak Pancholi, Bangalore (IN); Manuel Antonio D'Abreu, EL Dorado Hills, CA (US); Radhakrishnan Nair, Kerala (IN); Stephen Skala, Fremont, CA (US)

(73) Assignee: Sandisk Technologies Inc., Plano, TX (US)

( * ) Notice: Subject to any disclaimer, the term of this patent is extended or adjusted under 35 U.S.C. 154(b) by 140 days.

(21) Appl. No.: 13/450,963

(22) Filed: Apr. 19, 2012

(65) Prior Publication Data

US 2013/0246878 A1    Sep. 19, 2013

Related U.S. Application Data

(60) Provisional application No. 61/611,148, filed on Mar. 15, 2012.

(30) Foreign Application Priority Data

Mar. 20, 2012    (IN) .......................... 1014/CHE/2012

(51) Int. Cl.
*H03M 13/00*    (2006.01)
*G11C 29/00*    (2006.01)
(Continued)

(52) U.S. Cl.
CPC .............. *H03M 7/4093* (2013.01); *H03M 7/40* (2013.01); *H03M 7/4031* (2013.01); *H03M 7/405* (2013.01); *H03M 13/00* (2013.01);
(Continued)

(58) Field of Classification Search
CPC ... H03M 7/4093; H03M 7/40; H03M 7/4031; H03M 7/405; H03M 13/00; H03M 13/2927; H03M 13/6318; H03M 13/2957; H03M 13/21; H03M 13/25; H03M 13/255; H03M 13/258; H03M 13/35; H03M 13/3707; H03M 13/47; H03M 13/63; H03M 13/152; H03M 13/6513; H03M 13/6516; H03M 13/6561; H03M 13/6572; H04N 19/00121; H04N 19/00951; H04L 2209/34; G06F 11/1008
USPC ......... 714/779, 752, 758, 760, 763, 768, 773, 714/774, 782, 784, 794, 799, 803, 718
See application file for complete search history.

(56) References Cited

U.S. PATENT DOCUMENTS 5,357,527 A * 10/1994 Coates et al. ................. 714/755
5,990,963 A * 11/1999 Mishima et al. ......... 375/240.24
(Continued)

FOREIGN PATENT DOCUMENTS

EP    2299362 A2    3/2011
WO    2006013529 A1    2/2006
(Continued)

OTHER PUBLICATIONS

Grangetto et al., Error Correction by Means of Arithmetic Codes: An Application to Resilient Image Transmission, Apr. 6, 2003, IEEE, pp. 273-276.*

(Continued)

*Primary Examiner* — John J Tabone, Jr.
(74) *Attorney, Agent, or Firm* — Toler Law Group, PC

(57) ABSTRACT

A method may be performed at a data storage device that includes a memory and a controller. The method includes providing user data to a variable-bit error correction coding (ECC) encoder. The ECC encoder generates a first set of parity bits. A first number of parity bits in the first set of parity bits is determined based on stored counts of read errors. The method also includes storing the user data and the first set of parity bits to a memory of the data storage device.

23 Claims, 5 Drawing Sheets

(51) Int. Cl.

| | | |
|---|---|---|
| *H03M 13/03* | (2006.01) | |
| *H03M 7/40* | (2006.01) | |
| *H03M 13/29* | (2006.01) | |
| *H03M 13/21* | (2006.01) | |
| *H03M 13/25* | (2006.01) | |
| *H03M 13/35* | (2006.01) | |
| *H04N 19/13* | (2014.01) | |
| *H04N 19/91* | (2014.01) | |

(52) U.S. Cl.
CPC ...... *H03M 13/2927* (2013.01); *H03M 13/6318* (2013.01); *H03M 13/2957* (2013.01); *H03M 13/21* (2013.01); *H03M 13/25* (2013.01); *H03M 13/255* (2013.01); *H03M 13/258* (2013.01); *H03M 13/35* (2013.01); *H04N 19/00121* (2013.01); *H04N 19/00951* (2013.01)
USPC ........... 714/779; 714/752; 714/758; 714/760; 714/763; 714/768; 714/773; 714/774; 714/782; 714/784; 714/794; 714/799; 714/803; 714/718

(56) References Cited

U.S. PATENT DOCUMENTS

| | | | | |
|---|---|---|---|---|
| 6,029,265 | A * | 2/2000 | Itoi et al. | 714/755 |
| 6,490,243 | B1 * | 12/2002 | Tanaka et al. | 370/216 |
| 6,530,055 | B1 * | 3/2003 | Fukunaga | 714/746 |
| 6,591,394 | B2 | 7/2003 | Lee et al. | |
| 6,961,890 | B2 * | 11/2005 | Smith | 714/763 |
| 8,533,558 | B2 * | 9/2013 | Yurzola et al. | 714/758 |
| 2003/0037299 | A1 | 2/2003 | Smith | |
| 2004/0120404 | A1 * | 6/2004 | Sugahara et al. | 375/240.23 |
| 2006/0200706 | A1 * | 9/2006 | Lamy | 714/100 |
| 2008/0244370 | A1 | 10/2008 | Lam | |
| 2009/0031186 | A1 | 1/2009 | Matsumoto et al. | |
| 2009/0249168 | A1 * | 10/2009 | Inoue | 714/763 |
| 2011/0072333 | A1 * | 3/2011 | Kuo | 714/773 |
| 2011/0099460 | A1 | 4/2011 | Dusija et al. | |

FOREIGN PATENT DOCUMENTS

| | | |
|---|---|---|
| WO | 2008045893 A1 | 4/2008 |
| WO | 2009032945 A1 | 3/2009 |

OTHER PUBLICATIONS

Lamy et al., Optimised constructions for variable-length error correcting codes, Mar. 31, 2003, ITW2003, pp. 1-4.*
Lamy et al., Lowcomplexity Iterative Decoding of Variable-Length Codes, Nov. 12, 2010, IEEE, pp. 1-4.*
Lee at al., HVLC: Error Correctable Hybrid Variable Length Code for Image Coding in Wireless Transmission, Jun. 5, 2000, IEEE, vol. 4, pp. 2103-2106.*
The International Search Report and Written Opinion mailed May 15, 2013 in International Application No. PCT/ US2013/029175, 8 pages.

* cited by examiner

STATISTICAL DISTRIBUTION BASED VARIABLE-BIT ERROR CORRECTION CODING

REFERENCE TO EARLIER-FILED APPLICATIONS

This application claims priority from U.S. Provisional Patent Application No. 61/611,148, filed Mar. 15, 2012, and from Indian Application No. 1014/CHE/2012, filed Mar. 20, 2012. The contents of each of these applications are incorporated by reference herein in their entirety.

FIELD OF THE DISCLOSURE

The present disclosure is generally related to variable-bit error correction coding (ECC) and its application.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Although increasing the number of bits per cell and reducing device feature dimensions may increase storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g. "parity bits") that may be stored with the data as an ECC codeword. As more parity bits are used, an error correction capacity of the ECC increases and a number of bits required to store the encoded data also increases.

Increasing a number of parity bits improves a correction capability of an ECC scheme. However, decoding latency and power consumption may also increase as the number of parity bits are increased. For a memory device that has relatively few errors when the memory device is new but experiences increased bit errors as the device ages. Using a large number of parity bits increases latency and power consumption over the life of the device even though the additional error correction capability provided by the additional parity bits is not utilized until the device approaches an end of its useful life.

SUMMARY

Data is encoded using a variable-bit ECC encoder prior to storage at a memory. The variable-bit ECC encoder is configured to use a number of parity bits determined to achieve a threshold probability of error correction of the data. The number of parity bits may be determined based on a statistical error rate of data read from the memory. As the memory ages and error rates increase, the number of parity bits increases to maintain an error correction capability that satisfies the threshold probability of error correction.

DETAILED DESCRIPTION

Figure 1:
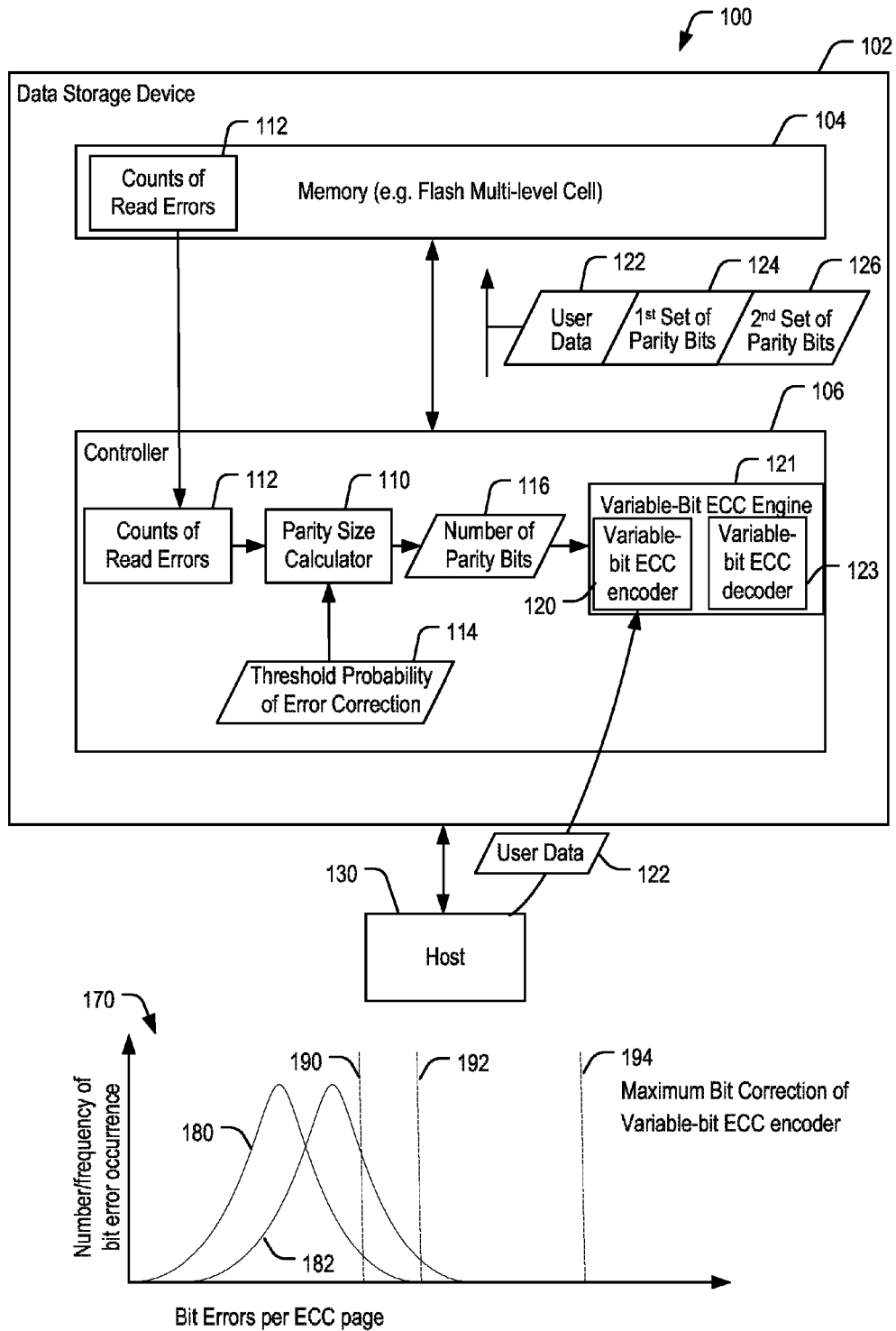
FIG. 1 is a diagram of a particular illustrative embodiment of a system including a data storage device configured to encode data with a variable-bit ECC encoder that uses a number of parity bits determined based on statistical distribution of read errors.

Referring to FIG. 1, a particular embodiment of a system 100 includes a data storage device 102 coupled to a host device 130. The data storage device 102 is configured to encode data at a variable-bit ECC encoder using a number of parity bits that may be pre-determined based on the quality of devices or based on a statistical distribution of stored counts of read errors.

The host device 130 may be configured to provide data, such as user data 122, to be stored at a memory 104 within the data storage device 102 or to request data to be read from the memory 104. For example, the host device 130 may include a mobile telephone, a music or video player, a gaming console, an electronic book reader, a personal digital assistant (PDA), a computer, such as a laptop computer, a notebook computer, or tablet, any other electronic device, or any combination thereof.

The data storage device 102 includes the memory 104 coupled to a controller 106. The memory 104 may be a non-volatile memory, such as a NAND flash memory. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples.

The controller 106 is configured to receive data and instructions from and to send data to the host device 130 while the data storage device 102 is operatively coupled to the host device 130. The controller 106 is further configured to send data and commands to the memory 104 and to receive data from the memory 104. For example, the controller 106 is configured to send data and a write command to instruct the memory 104 to store the data to a specified address. As another example, the controller 106 is configured to send a read command to read data from a specified address of the memory 104.

The controller 106 includes a variable-bit ECC engine 121 that is configured to receive data to be stored to the memory 104 and to generate an encoded word. For example, the variable-bit ECC engine 121 includes a variable-bit ECC encoder 120 configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode according to one or more other ECC encoding schemes, or any combination thereof. The variable-bit ECC engine 121 may include a variable-bit decoder 123 configured to decode data read from the memory 104 to detect and correct, up to an error correction capability of the ECC scheme, bit errors that may be present in the data.

The controller 106 also includes a parity size calculator 110. The parity size calculator 110 is configured to receive counts of read errors 112 and to generate a number of parity bits 116 based on a threshold probability of error correction 114. For example, the parity size calculator 110 may determine the number of parity bits 116 to enable decoding of data with a probability of success that approximates the threshold probability 114. To illustrate, if the threshold probability 114 corresponds to approximately 95% likelihood of successful error correction, the parity size calculator 110 may calculate the number of parity bits 116 to be sufficient for correcting 95 out of 100 data words based on historical (statistical) error occurrences (i.e. the counts of read errors 112).

The counts of read errors 112 may be read from the memory 104 and used by the controller 106 to determine the number of parity bits 116. The counts of read errors 112 include counts of read errors for each unit of data (e.g. each ECC page) that has been read from the memory 104. For example, when data is read from the memory 104 and decoded by the variable-bit ECC decoder 123, a number of errors that are corrected may be determined. The count of determined errors may be added to the counts of read errors 112. In this manner, as more counts of read errors are generated, a statistical likelihood that the threshold probability of error correction 114 is attained by the selected number of parity bits 116 may be improved.

The parity size calculator 110 may receive the counts of read errors 112 and percentage information (i.e. the threshold probability of error correction 114 may indicate "95%") and compute the number of parity bits 118 based on the error counts and the percentage information. For example, the number of parity bits 116 may be selected to correspond to the threshold probability of error correction 114 based on the stored counts of read errors 112 by determining an estimated number of bit errors corresponding to the threshold probability of error correction 114. To illustrate, if the threshold probability of error correction 114 is 95%, the stored counts of read errors 112 may be sorted (e.g. from fewest errors to most errors) and a particular count of read errors may be selected or computed by interpolation so that the particular count is greater than or equal to approximately 95% of the stored counts of read errors 112. As another illustration, the parity size calculator 110 may apply one or more curve-fitting techniques to compute parameters of a curve that approximates a distribution of the stored counts of read errors 112, such as a mean and variance of a Gaussian-type curve. Based on the computed parameters, the parity size calculator 110 may determine a particular count of read errors corresponding to 95% of the area under the curve. In some implementations all of the counts of read errors 112 may be considered (i.e. representing an entire recorded history of detected errors) while in other implementations a subset of the counts of read errors 112 (e.g. representing only a recent history of detected errors) may be considered when determining the particular count of read errors.

After determining the particular count of read errors based on the historical error data (i.e. based on all or part of the counts of read errors 112), the number of parity bits 116 may be determined as a fewest number of parity bits that enable correction of the particular count of read errors. An ECC encoding scheme with an actual or approximate relationship between parity bits and correction capability may be used. (To illustrate, in a BCH code used by the variable-bit ECC engine 121, adding one additional parity bit may improve the error correction capability by a finite percentage.) As another example, the parity size calculator 110 may retrieve the number of parity bits 116 via a lookup table operation using the particular count of read errors as an index to the table.

The variable-bit ECC engine 121 may operate according to a real-time statistical distribution based on the stored counts of read errors 112, where bit correction capability of the variable-bit ECC engine 121 may be derived from a real-time statistical distribution of occurring errors. The number of parity bits 116 may be determined in real-time based on statistical analysis of the errors that occurred during different read/write operations such that with the number of parity bits 116 the probability of correcting the errors is estimated to be approximately 95%. Although 95% is used as an illustrative example, in other implementations other threshold probabilities may be used, such as 85%, 90%, 99%, or any other probability.

A graph 170 illustrates example distributions of the counts of read errors 112. A first distribution 180 may correspond to historical data demonstrating that the memory 104 introduces relatively few errors into stored data as compared to a second distribution 182. For example, the first distribution 180 may graphically represent the counts of read errors 112 at one time during the life of the data storage device 102 and the second distribution may graphically represent the counts of read errors 112 at another time during the life of the data storage device 102. The second distribution 182 illustrates an increase in bit errors that may be caused by aging of the memory 104.

When the counts of read errors 112 correspond to the first distribution 180, the number of parity bits 116 may be selected to satisfy the threshold probability 114 by correcting up to a first number of bit errors 190. When the counts of read errors 112 correspond to the second distribution 182, the number of parity bits 116 may be increased to satisfy the threshold probability 114 by correcting up to a second number of bit errors 192, up to a maximum number of parity bits corresponding to a maximum bit correction capability 194 of the variable-bit ECC engine 121. As the number of read operations increases, the statistical distribution may become more accurate and a probability of correcting ECC pages may more closely approximate the threshold probability 114 (e.g. 95%).

The variable-bit ECC encoder 120 may be configured to receive user data 122 and to encode the user data 122 according to the number of parity bits 116. The variable-bit ECC encoder 120 may be configurable to encode the user data 122 with a smaller number of parity bits to reduce decoding complexity, power consumption, and an amount of storage in the memory 104 required for the parity bits. Alternatively, the variable-bit ECC encoder 120 may be configured to encode the user data 122 using a larger number of parity bits, up to and including the largest set of parity bits supported by the variable-bit ECC encoder 120. The largest set of parity bits supported by the variable-bit ECC encoder 120 may provide a highest level of error correction attainable by the variable-bit ECC encoder 120 with increased complexity, power consumption, and decoding latency as compared to using fewer parity bits.

During operation, the controller 106 is configured to determine the number of parity bits 116 by operation of the parity size calculator 110 using the stored counts of read errors 112 and the threshold probability of error correction 114. For example, the counts of read errors 112 may be copied to the memory 104 for future use by the controller 106 to be accessible to the parity size calculator 110. The variable-bit ECC encoder 120 is responsive to the number of parity bits 116 to encode the user data 122, such as user data received from the host device 130. The user data 122 and the resulting parity bits may be stored to the memory 104 as an ECC encoded word that includes the user data 122 and a first set of parity bits 124. The first set of parity bits 124 may have a number of parity bits equal to the number of parity bits 116. The variable-bit ECC encoder 120 may generate a second set of parity bits 126, such as a maximum set of parity bits supported by the variable-bit ECC engine 121, that may be used for decoding the user data 122 if a number of errors exceeds a correction capability provided by the first set of parity bits 124.

When reading the user data 122 from the memory 104, the controller 106 may be configured to retrieve the user data 122 and the first set of parity bits 124 from the memory 104. The controller 106 may be configured to decode the user data 122 at the variable-bit ECC engine 121 using the first set of parity bits 124. Decoding using the first set of parity bits 124 may result in a probability of successful error correction that approximately equals the threshold probability of error correction 114. For example, if the threshold probability of error correction 114 corresponds to 95% likelihood of successful error correction, decoding the user data 122 based on the first set of parity bits 124 may be expected to succeed for approximately 95% of read operations. In the event more errors appear in the user data 122 and in the first set of parity bits 124 than are correctable using the first set of parity bits 124, a second decode operation may be performed using a larger set of parity bits to decode the user data 122, such as the second set of parity bits 126, as described with respect to FIGS. 2-3. By adjusting operation of the variable-bit ECC encoder 120 to select a number of parity bits to satisfy the threshold probability of error correction 114, power consumption and decoding latency associated with retrieving and decoding the user data 122 may be reduced as compared to using a largest supported set of parity bits of the variable-bit ECC encoder 120.

Figure 2:
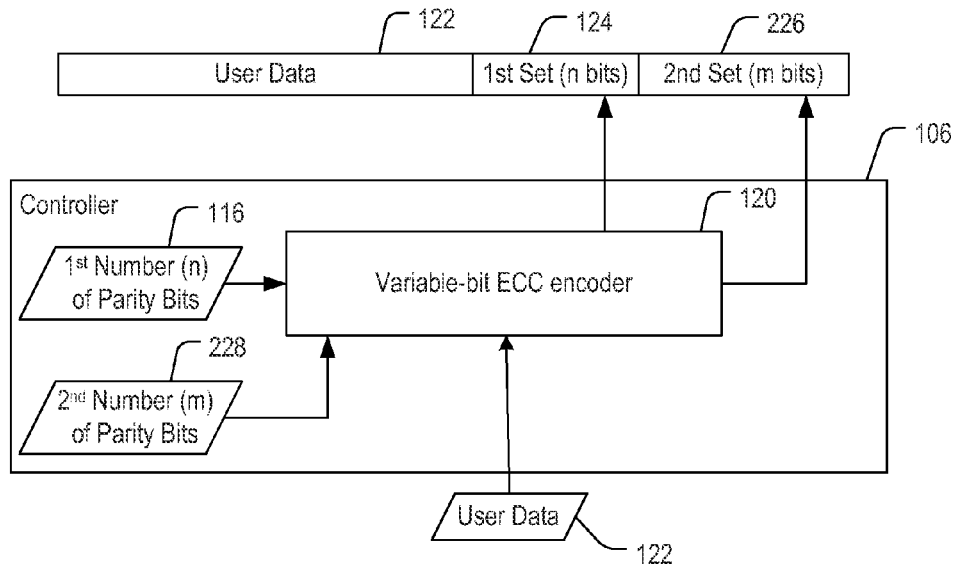
FIG. 2 is a block diagram illustrating a first particular embodiment of components including a single variable-bit ECC encoder that may be incorporated in the data storage device of FIG. 1.

Referring to FIG. 2, a particular embodiment of the controller 106 is illustrated having a single variable-bit ECC encoder 120 that generates two sets of parity bits for a data word. The variable-bit ECC encoder 120 receives the first number (n) of parity bits 116 for encoding the user data 122. The variable-bit ECC encoder 120 is responsive to the first number 116 to generate the first set of parity bits 124 having n bits. The controller 106 is also configured to initiate an encoding operation at the variable-bit ECC encoder 120 to generate a second set of parity bits 226. The variable-bit ECC encoder 120 also receives a second number (m) of parity bits 228 for encoding the user data 122. The variable-bit ECC encoder 120 is responsive to the second number 228 to generate the second set of parity bits 226 corresponding to the user data 122.

The user data 122, the first set of parity bits 124, and the second set of parity bits 226 may be stored to the memory 104 to be retrievable upon request for a data read from the memory 104. By storing the first set of parity bits 124 (with a reduced number of parity bits) and also storing the second set of parity bits 226 (with a larger number of parity bits), a data read may be performed by reading the user data 122 and the first set of parity bits 124 and initially attempting decoding using the first set of parity bits 124. In response to decoding success, no further decoding is performed and the user data 122 may be provided to the host device 130.

However, in response to a decoding failure using the first set of parity bits 124, a second decoding operation may be performed using the second set of parity bits 226. The second set of parity bits 226 may provide a higher level of error correction capability than the first set of parity bits 124. For example, the second number of parity bits 228 may represent a largest number of parity bits supported by the variable-bit ECC encoder 120. In this case, a largest number of errors correctable by the data storage device 120 may be used for decoding the user data 122. As another example, the second number of parity bits 228 may be less than the largest number of parity bits supported by the variable-bit ECC encoder 120. The second number of parity bits 228 may be selected based on a second threshold probability, such as a $10^{-10}$ likelihood of decoding failure, as an illustrative example.

Although the variable-bit ECC encoder 120 is depicted as receiving an indication of the second number 228, in other implementations the variable-bit ECC encoder 120 may generate the second set of parity bits 226 without receiving the second number 228 as an input to the variable-bit ECC encoder 120. For example, the variable-bit ECC encoder 120 may generate the second set of parity bits 226 using a default number of parity bits. To illustrate, the default number may be a largest number of parity bits that is supported by the variable-bit ECC encoder 120 or may be some other default value.

Figure 3:
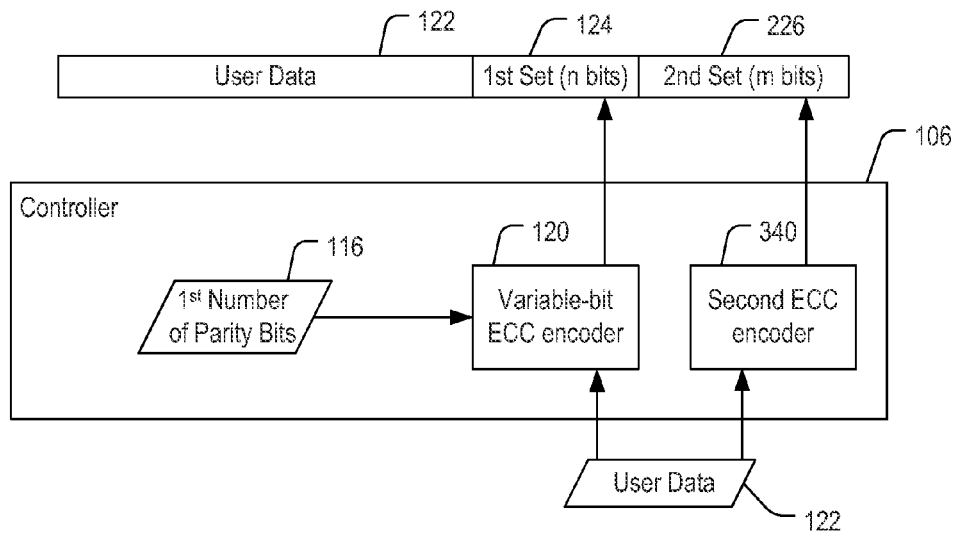
FIG. 3 is a block diagram illustrating a second particular embodiment of components including a variable-bit ECC encoder and a second ECC encoder that may be incorporated in the data storage device of FIG. 1.

Referring to FIG. 3, another embodiment of the controller 106 is depicted including the variable-bit ECC encoder 120 and a second ECC encoder 340. The variable-bit ECC encoder 120 is responsive to the first number of parity bits 116 to encode the user data 122 and to generate the first set of parity bits 124. The controller 106 is configured to initiate an encoding operation at the second ECC encoder 340 to generate the second set of parity bits 126. The second ECC encoder 340 may be a fixed-bit encoder that is responsive to the user data 122 to generate the second set of parity bits 226. In contrast to the embodiment of FIG. 2, the user data 122 may be encoded at the variable-bit ECC encoder 120 in parallel with encoding at the second ECC encoder 340 resulting in decreased encoding latency. However, in the embodiment of FIG. 2, a single ECC encoder is implemented in the controller 106, resulting in reduced complexity, device size, and power consumption as compared to using multiple ECC encoders.

The variable-bit ECC decoder 123 of FIG. 1 may be used for decoding the user data 122 using the first set of parity bits 124 and may also be used for decoding the user data 122 using the second set of parity bits 126. Alternatively, another ECC decoder (not shown) may be used for decoding user data using the second set of parity bits 126.

Figure 4:
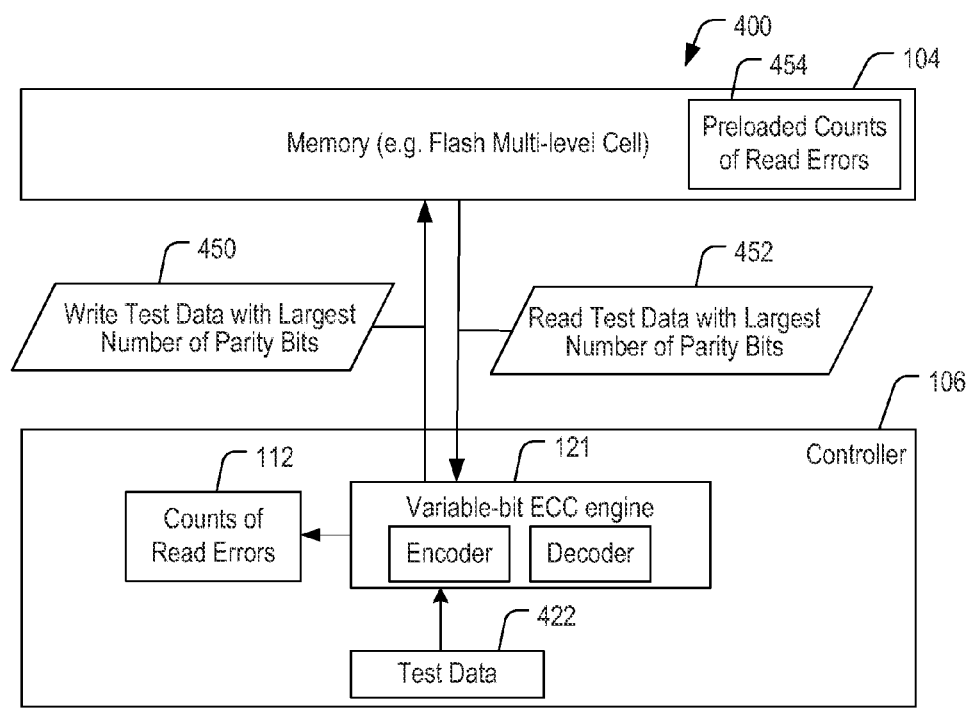
FIG. 4 is a block diagram illustrating a third particular embodiment of components configured to initialize counts of read errors that may be incorporated in the data storage device of FIG. 1.

Referring to FIG. 4, an embodiment of initialization of the counts of read errors 112 of FIG. 1 is depicted and generally designated 400. The controller 106 is coupled to the memory 104 and includes the variable-bit ECC engine 121 that includes an encoder and a decoder. For example, the variable-bit ECC engine 121 may include the variable-bit ECC encoder 120 of FIG. 1.

The controller 106 may generate test data 422 that is provided to the variable-bit ECC encoder 121 using a largest number of parity bits supported by the variable-bit ECC engine 121. The encoded data may be written to the memory 104 as write test data 450. The written data may be read back as read test data 452 and provided to the variable-bit ECC engine 121. Counts of read errors detected in the read test data 452 (by comparison to the test data 422) may be stored to establish initial values of the counts of read errors 112.

To illustrate, a selected number of word lines (e.g. 100 word lines) of test data may be encoded and stored to the memory 104 and then read back and decoded to generate a statistically significant set of initial counts of read errors 112. After generating the initial counts of read errors 112, an initial number of parity bits 116 may be generated to achieve an expected probability of error correction, such as described with respect to FIG. 1.

Alternatively, or in addition to generating the test data 422 to determine initial counts of read errors 112, the memory 104 may include preloaded counts of read errors 454. The preloaded counts of read errors 454 may be preloaded data that is written to the memory 104 prior to a first storage of user-provided data to the memory 104. For example, the preloaded counts of read errors 454 may be preloaded to the memory 104 prior to distribution of the data storage device 102 to users. In another example, the initial counts of read errors 112 may not be generated using the test data 422 or the preloaded counts of read errors 454 and may instead be generated based on user data, such as described in further detail with respect to FIG. 6.

Figure 5:
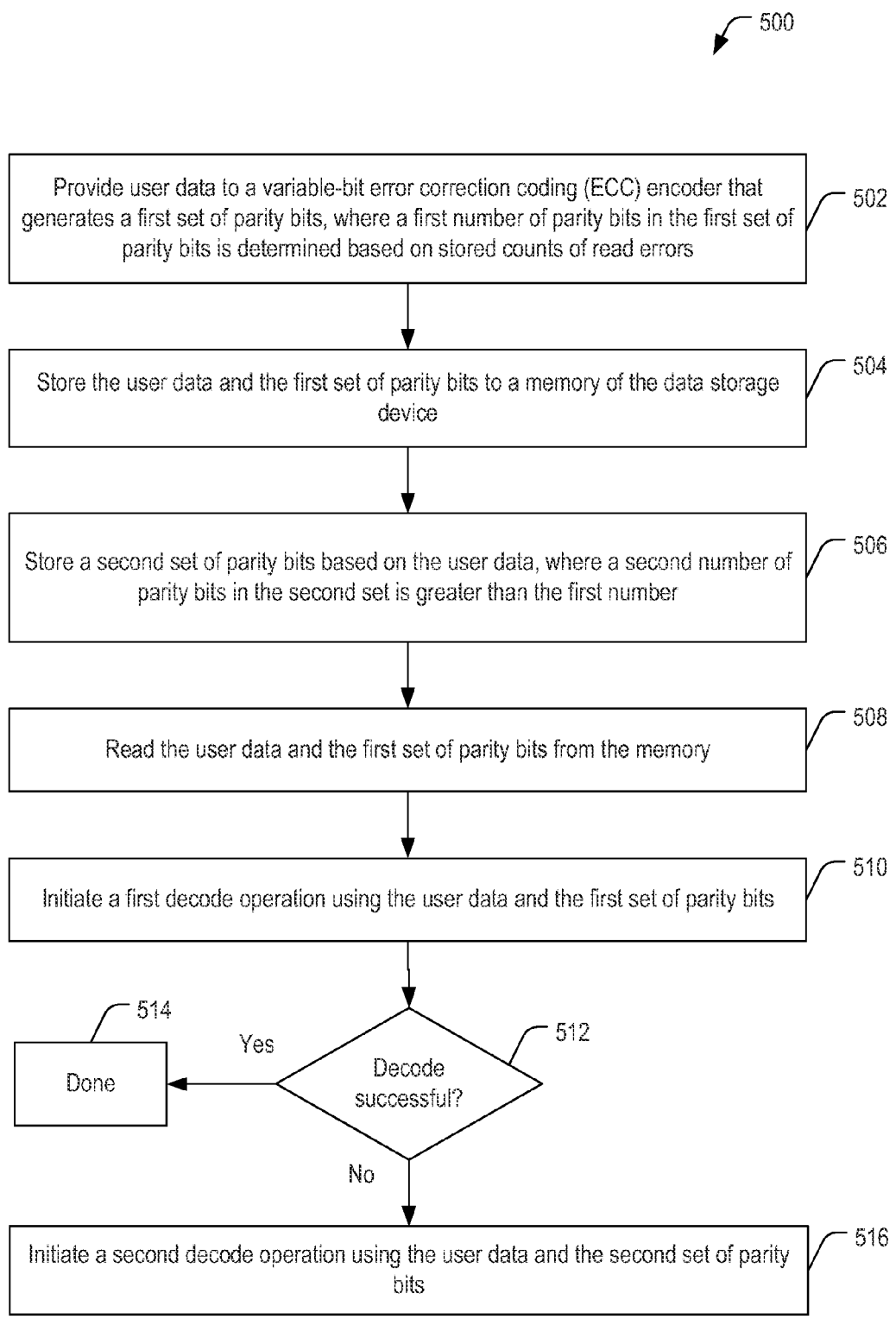
FIG. 5 is a flow chart of a particular embodiment of a method of variable-bit ECC encoding.

Referring to FIG. 5, a particular embodiment of a method 500 of using variable-bit ECC encoding based on stored counts of read errors is depicted. The method 500 may be performed in a data storage device, such as the data storage device 102 of FIG. 1.

User data is provided to a variable-bit error correction coding (ECC) encoder that generates a first set of parity bits, at 502. For example, the variable-bit ECC encoder 120 of FIG. 1 receives the user data 122 and generates the first set of parity bits 124. A first number of parity bits in the first set of parity bits is determined based on stored counts of read errors, such as the counts of read errors 112 of FIG. 1. The first number of parity bits may be selected to correspond to a threshold probability of error correction based on the stored counts of read errors, such as described with respect to FIG. 1. As an example, the threshold probability may correspond to an approximately 95 percent likelihood of successful error correction using the first number of parity bits. The stored counts of read errors may be initialized by retrieving pre-loaded data written to the memory prior to a first storage of user-provided data to the memory, such as the preloaded counts of read errors 454 of FIG. 4. The stored counts of read errors may be updated each time data is read from the memory. To illustrate, an error count may be determined for every read operation that is performed at the memory 104 of FIG. 1 and the counts of read errors 112 may be updated to include the error count generated during each read operation.

The user data and the first set of parity bits are stored to a memory of the data storage device, at 504. For example, the user data and the first set of parity bits may correspond to the user data 122 and the first set of parity bits 124 stored to the memory 104 of FIG. 1.

A second set of parity bits based on the user data (e.g. the second set of parity bits 226 of FIG. 2 or FIG. 3) may be stored, at 506. A second number of parity bits in the second set is greater than the first number of parity bits. The second set of parity bits may correspond to a larger correction capacity than available using the first set of parity bits. As an example, the second set of parity bits may be generated by the variable-bit ECC encoder, such as the variable-bit ECC encoder 120 of FIGS. 1-2. The second set of parity bits may correspond to a largest correction capacity of the variable-bit ECC encoder or may correspond to less than the largest correction capacity of the variable-bit ECC encoder. As another example, the second set of parity bits may be generated by a second ECC encoder, such as the second ECC encoder 340 of FIG. 3.

When the user data is to be retrieved, such as in response to a read request from the host device 130 of FIG. 1, the user data and the first set of parity bits may be read from the memory, at 508. A first decode operation may be initiated using the user data and the first set of parity bits, at 510. For example, the first decode operation may be performed at the variable-bit ECC engine 121 of FIG. 1.

A determination may be made whether the first decode operation was successful, at 512. For example, the variable-bit ECC engine 121 of FIG. 1 may generate an output indicating that decoding is successful or indicating that a number of detected errors exceeds a maximum number of errors correctable using the first set of parity bits. In response to determining that the first decode operation was successful, at 512, the method ends, at 514. Otherwise, in response to the first decode operation failing, a second decode operation may be initiated using the user data and the second set of parity bits, at 516.

By initiating the first decode operation using the first set of parity bits that is smaller than the second set of parity bits, a decode latency and power consumption of the first decode operation may be reduced as compared to decoding using the second set of parity bits. In addition, a number of bits in the first set of parity bits may be selected in order to recover the user data at the decode operation based on a threshold probability of error correction so that decoding failure of the first decode operation, and subsequent decoding using the longer second set of parity bits, may occur relatively infrequently.

Figure 6:
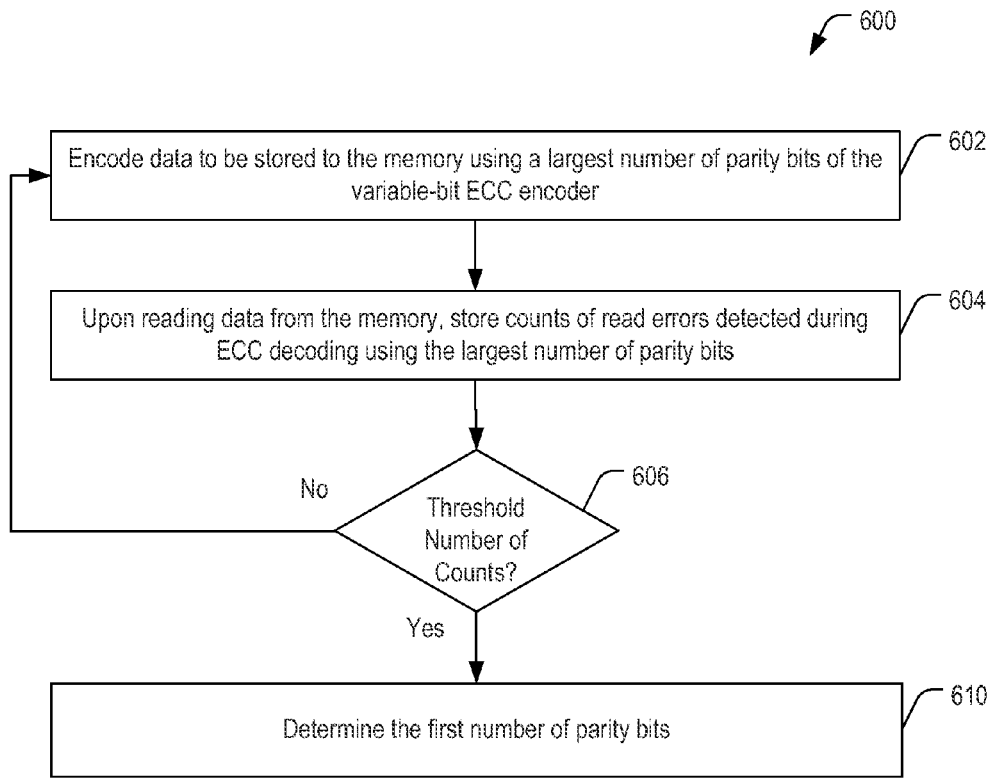
FIG. 6 is a flow chart of a particular embodiment of a method of initializing counts of read errors for use by a variable-bit ECC encoder.

Referring to FIG. 6, a particular embodiment of a method 600 of initializing stored counts of read errors is depicted. The method 600 may be performed in a data storage device, such as to initialize the counts of read errors 112 of the data storage device 102 of FIG. 1.

The method 600 may include encoding data to be stored to the memory using a largest number of parity bits of the variable-bit ECC encoder, at 602. For example, the encoded data may include test data generated by a controller of the data storage device, such as the test data 422 of FIG. 4. As another example, the encoded data may include user-provided data, such as the user data 122 of FIG. 1. The largest number of parity bits may be used to provide a strongest available error correction capability of the data storage device while initializing the stored counts of read errors.

Upon reading data from the memory, counts of read errors detected during ECC decoding using the largest number of parity bits may be stored, at 604. For example, the variable-bit ECC engine 121 of FIGS. 1 and 4 may generate an indication of a number of bit errors in each ECC word read from the memory 104. The indications of the number of bit errors may be stored by the controller 106 into the memory 104 to form (or augment) the counts of read errors 112 of FIGS. 1 and 4. To illustrate, the copy of the counts of read errors 112 in the controller 106 may be in a volatile memory of the controller 106 and may be lost upon power-down of the data storage device 102. By storing the count of errors (or error profile) in the memory 104, the data is preserved during power-down.

A determination may be made whether a threshold number of the counts of read errors have been stored, at 606. In response to storing the threshold number of the counts of read errors, the first number of parity bits may be determined, at 610. Otherwise, in response to determining that the threshold number of the counts have not been stored, at 606, processing may return to 602.

By initializing the counts of read errors based on data written to and read from the memory, statistical analysis of the counts of read errors may be more accurate for the particular memory as compared to an initial set of error count data that is not specific to the particular memory. As a result, a number of parity bits selected to satisfy a threshold probability of error correction (e.g. the number of parity bits 116 based on the threshold probability of error correction 114 of FIG. 1) may be determined more accurately than by using data that is not based on actual read operations from the memory.

Although various components depicted herein are illustrated as block components and described in general terms, such components may include one or more microprocessors, state machines, or other circuits configured to enable the data storage device 102 of FIG. 1 to perform the particular functions attributed to such components, or any combination thereof. For example, the parity size calculator 110 may represent one or more physical components, such as hardware controllers, state machines, logic circuits, or other structures, to enable the controller 106 of FIG. 1 to determine the number of parity bits 116 to correspond to the threshold probability of error correction 114 based on the counts of read errors 112.

For example, the parity size calculator 110 may be implemented using a microprocessor or microcontroller programmed to determine the number of parity bits 116 based on a statistical analysis of the stored counts of read errors 112. In a particular embodiment, the parity size calculator 110 includes executable instructions that are executed by a processor and the instructions are stored at the memory 104. Alternatively, or in addition, executable instructions that are executed by a processor that may be included in the parity size calculator 110 may be stored at a separate memory location that is not part of the memory 104, such as at a read-only memory (ROM) (not shown).

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device that includes a memory, wherein the memory has a three-dimensional (3D) memory configuration, performing:
      providing user data to a variable-bit error correction coding (ECC) encoder that generates a first set of parity bits, wherein a first number of parity bits in the first set of parity bits is determined based on stored counts of read errors;
      storing the user data, the first set of parity bits, and a second set of parity bits to the memory;
      reading the user data and the first set of parity bits from the memory;
      initiating a first decode operation using the user data and the first set of parity bits; and
      in response to the first decode operation failing, accessing the second set of parity bits to initiate a second decode operation that uses the user data and the second set of parity bits.

2. The method of claim 1, wherein the first number of parity bits is selected to correspond to a first threshold probability of error correction based on the stored counts of read errors, and wherein a second number of parity bits in the second set of parity bits is selected to correspond to a second threshold probability of error correction that is different than the first threshold probability of error correction.

3. The method of claim 2, wherein the first threshold probability corresponds to an approximately 95 percent probability of successful error correction using the first number of parity bits, and wherein the second threshold probability corresponds to between a 99 percent probability and a 100 percent probability of successful error correction using the second number of parity bits.

4. The method of claim 1, wherein a second number of parity bits in the second set is greater than the first number of parity bits.

5. The method of claim 4, wherein the second set of parity bits is generated by the variable-bit ECC encoder, and further comprising:
   receiving a first indication of the first number of parity bits at the variable-bit ECC encoder, wherein the first set of parity bits is generated based on the first indication of the first number of parity bits; and
   receiving a second indication of the second number of parity bits at the variable-bit ECC encoder, wherein the second set of parity bits is generated based on the second indication of the second number of parity bits.

6. The method of claim 4, wherein the second set of parity bits is generated by a second ECC encoder that is configured to encode data at a non-variable encoding rate, and wherein the variable-bit ECC encoder generates the first set of parity bits in parallel with the second ECC encoder generating the second set of parity bits.

7. The method of claim 4, wherein the second set of parity bits corresponds to a larger correction capacity than the first set of parity bits.

8. The method of claim 1, wherein the second set of parity bits is stored to the memory while the memory stores the user data and the first set of parity bits.

9. The method of claim 1, further comprising updating the stored counts of read errors each time data is read from the memory and a corresponding error count is determined.

10. The method of claim 1, wherein the stored counts of read errors are initialized by retrieving preloaded data written to the memory prior to a first storage of user-provided data to the memory.

11. The method of claim 1, wherein the stored counts of read errors are initialized by:
  encoding data to be stored to the memory using a largest number of parity bits of the variable-bit ECC encoder;
  upon reading the data from the memory, storing counts of read errors detected during ECC decoding using the largest number of parity bits; and
  in response to storing a first predetermined number of the counts of read errors, determining the first number of parity bits.

12. The method of claim 11, wherein the encoded data includes test data generated by a controller of the data storage device.

13. The method of claim 11, wherein the encoded data includes user-provided data.

14. A data storage device comprising:
  a memory, wherein the memory has a three-dimensional (3D) memory configuration; and
  a controller coupled to the memory, wherein the controller is configured to provide user data to a variable-bit error correction coding (ECC) encoder to generate a first set of parity bits, wherein the controller is further configured to store the user data, the first set of parity bits, and a second set of parity bits to the memory, wherein a first number of parity bits in the first set of parity bits is determined based on stored counts of read errors, and wherein the controller is further configured to read the user data and the first set of parity bits from the memory, to initiate a first decode operation using the user data and the first set of parity bits, and to access, in response to the first decode operation failing, the second set of parity bits to initiate a second decode operation that uses the user data and the second set of parity bits.

15. The data storage device of claim 14, wherein the first number of parity bits is selected in response to determining that the first number of parity bits corresponds to a fewest number of parity bits that enables a threshold probability of error correction based on the stored counts of read errors.

16. The data storage device of claim 14, wherein a second number of parity bits in the second set is greater than the first number of parity bits.

17. The data storage device of claim 14, wherein the controller is further configured to initiate an encoding operation at the variable-bit ECC encoder to generate the second set of parity bits.

18. The data storage device of claim 14, further comprising a second ECC encoder, wherein the controller is further configured to initiate an encoding operation at the second ECC encoder to generate the second set of parity bits.

19. The data storage device of claim 14, wherein the controller is further configured to determine a particular count of read errors associated with decoding the user data during the second decode operation and to add the particular count of read errors to the counts of read errors to generate updated counts of read errors.

20. The data storage device of claim 14, wherein the second set of parity bits corresponds to a larger correction capacity than the first set of parity bits.

21. The data storage device of claim 14, wherein the controller is further configured to update the stored counts of read errors each time data is read from the memory and a corresponding error count is determined.

22. The data storage device of claim 14, wherein the stored counts of read errors are initialized by retrieving preloaded data written to the memory prior to a first storage of user-provided data to the memory.

23. The data storage device of claim 14, wherein the controller is further configured to receive a single request for read access to the user data from a host device that is operationally coupled to the controller, and wherein the first decode operation and the second decode operation are initiated by the controller in response to receiving the single request from the host device.

* * * * *